United States Patent [19]

Chen

[11] Patent Number: 5,578,923
[45] Date of Patent: Nov. 26, 1996

[54] T2 RESTORATION AND NOISE SUPPRESSION OF HYBRID MR IMAGES USING WIENER AND LINEAR PREDICTION TECHNIQUES

[75] Inventor: Haiguang Chen, San Francisco, Calif.

[73] Assignee: The Regents of the University of California, Berkeley, Calif.

[21] Appl. No.: 493,014

[22] Filed: Jun. 21, 1995

Related U.S. Application Data

[62] Division of Ser. No. 145,742, Nov. 4, 1993.

[51] Int. Cl.$^6$ .................................................. G01R 33/20
[52] U.S. Cl. ................................. 324/309; 128/653.2
[58] Field of Search .................................. 324/300, 307, 324/309, 314; 128/653.2

[56] References Cited

U.S. PATENT DOCUMENTS

| | | | |
|---|---|---|---|
| 4,973,111 | 11/1990 | Haacke et al. ................ | 324/309 |
| 5,218,299 | 6/1993 | Dunkel ........................... | 324/307 |
| 5,229,716 | 7/1993 | Demoment et al. ............ | 324/307 |
| 5,262,725 | 11/1993 | Cuppen et al. ................. | 324/309 |
| 5,297,033 | 3/1994 | Bito et al. ...................... | 324/309 |
| 5,345,173 | 9/1994 | Bito et al. ...................... | 324/309 |
| 5,420,508 | 5/1995 | Smith ............................. | 324/307 |

OTHER PUBLICATIONS

Chen et al, "T2 Restoration and Noise Suppression of hybrid MR images using Wiener & Linear Prediction Techniques", 1993 IEEE Conference Record Nuclear Sci Symposium & Medical Imaging Conference vol. 3 (abstract only) (1933).

Chen et al, "T2 Restoration and noise Suppression of hybrid images using Wiener & Linear Prediction techniques" IEEE Transactions on Medical Imaging (Dec., 1994) (abstract only).

Primary Examiner—Sandra L. O'Shea
Assistant Examiner—Raymond Y. Mah
Attorney, Agent, or Firm—Nixon & Vanderhye P.C.

[57] ABSTRACT

Hybrid imaging (HI) sequences used for magnetic resonance (MR) imaging and inherently degraded by T2 effects and additive measurement noise are enhanced. Wiener filter and linear prediction (LP) technique is used to process HI MR signals in the spatial frequency domain (K-space) and the hybrid domain respectively. Based on the average amplitude symmetry constraint of the spin echo signal, the amplitude frequency response function of the T2 distortion is estimated and used in the Wiener filter for a global T2 amplitude restoration. Then a linear prediction technique is utilized to obtain local signal amplitude and phase estimates around discontinuities of the frequency response function of the equivalent T2 distortion filter. These estimates are used to make local amplitude and phase corrections. The effectiveness of this combined technique in correction T2 distortion and reducing the measurement noise is analyzed and demonstrated using experiments on both phantoms and humans.

2 Claims, 8 Drawing Sheets

T2 RESTORATION AND NOISE SUPPRESSION OF HYBRID MR IMAGES USING WIENER AND LINEAR PREDICTION TECHNIQUES

This is a divisional of application Ser. No. 08/145,742, field Nov. 4, 1993, (still pending).

BACKGROUND OF THE INVENTION

1. Field of the Invention

This invention relates generally to the field of magnetic resonance (MR) imaging (MRI) utilizing NMR phenomena. It is particularly related to enhancement of MR imaging data acquired using hybrid imaging (HI) MR data acquisition sequences which include T2 and additive noise degradation effects.

2. Related Art

Magnetic resonance (MR) imaging techniques are now extensively used for noninvasive investigations of living matter in medicine and biology. Researchers in different MR groups are trying to further improve the performance and the accessibility of MR image machines through lower cost, shorter scan time, higher resolution and contrast, higher signal/noise ratio and fewer artifacts. [L. Kaufman, L. E. Crooks and J. Carlson, "Technology Requirements for Magnetic Resonance Imaging System," in *Proceedings of Technology Requirements of Biomedical Imaging*, IEEE Computer Society Press, May 1991] Among these, reducing imaging time while maintaining image quality has been a very active topic.

In 1978, Mansfield et. al. demonstrated echo planar imaging (EPI) [P. Mansfield and P. G. Morris, "NMR Imaging in Biomedicine," in *Advances in Magnetic Resonance*, Edited by J. S. Waugh, Academic Press, New York, 1982]. The basic concept behind EPI is that successive spin echoes can be used to encode position information using just a single shot (i.e., a single NMR RF excitation data acquisition sequence). Because of high requirements on gradient coils and power supplies for achieving rapid echo train generation and some other problems, various hybrid imaging (HI) approaches, incorporating aspects of both conventional two-dimensional (2-D) FT imaging and EPI, have been proposed. [Hennig et al. J. Hennig, A. Nauerth and H. Friedberg, "RARE Imaging: A fast imaging Method for Clinical MR." *Magne, Reson, Med.*, Vol. 3, pp. 823–33, 1986; Van Uijen et al. C. M. J. Van Uijen, J. H. Den Boef and F. J. J. Verschuren; Haacke et al. E. M. Haacke, F. H. Bearden, J. R. Clayton and N. R. Lingar, "Reduction of MR Imaging Time and Hybrid Fast Scan Technique," *Radiology*, Vol. 158, pp. 521–29, 1986; and others ] These techniques use multiple (M) excitations and after each excitation, multiple (N) echoes are used to encode positional information. HI techniques are far less demanding on hardware and thus can be used to decrease imaging time without the cost and technical constraints of EPI.

Since in EPI and HI, phase encoding measurements acquired at different echo times are used to form an image, there are inherently T2 distortions in the acquired data along the phase encoding direction. Depending upon the phase encoding schemes used and the object under the study, loss of spatial resolution and/or contrast may be introduced. [R. T. Constable and J. C. Gore, "The Loss of Small Objects in Variable TE Imaging: Implications for FSE, RARE, and EPI." *Magne, Reson. Med.*, Vol. 28, pp. 9–24, 1992; D. A. Ortendahl, L. Kaufman and D. M. Kramer, "analysis of Hybird Imaging Techniques," *Magne, Reson. Med.*, Vol. 26, pp. 155–73, 1992] Furthermore, there are discontinuities in the frequency response of the effective T2 distortion filter and these discontinuities generate ringing artifacts in the image. Techniques such as inverse filtering have been tried to reduce those T2 effects, based on some prior knowledge about the T2 values of the objects under study. The success of this approach is often limited by lack of knowledge about the T2 values and the existence of measurement noise. The problem of ringing artifacts caused by local discontinuities in the frequency response function of the T2 filter have not yet been successfully addressed.

It is well known that a Weiner filter performs better for image restoration in a noisy environment. [R. C. Gonzalez and P. Wintz, *Digital Image Processing*, Addison-Wesly Publishing Company, 1988; A. K. Jain, *Fundamentals of Digital Image Processing*, Prentice Hall, Englewood Cliffs, N.J. 07632, 1989]

The techniques of linear and nonlinear prediction have also been used to reduce truncation artifacts in MR imaging by several people. [M. R. Smith, S. T. Nichols, R. M. Henkelman and M. L. Wood, "Application of Autoregressive Moving Average Parametric Modeling in Magnetic Resonance Image Reconstruction," IEEE *Trans. Med. Image.*, Vol. 5, pp. 132–39, 1986; J. F. Martin and C. F. Tirendi, "Modified Linear Prediction Modeling in Magnetic Resonance Imaging," *J. Magn. Reson.*, Vol. 82, pp. 392–99 1989; E. M. Haacke, Z. Liang and S. H. Izen, "Super Resolution Reconstruction through Object Modeling and Parameter Estimation," IEEE *Trans. ASSP.*, Vol. 37, pp. 592–95, 1989; H. Yan and J. Mao, "Data Truncation Artifact Reduction in MR Imaging Using A Multilayer Neural Network," IEEE *Trans. Med. Imag.*, Vol. 12, pp. 73–77, 1993]

BRIEF SUMMARY OF THE INVENTION

It has now been discovered that a combined use of a Wiener filter and linear prediction (LP) to process HI images better moderates T2 and noise effects. In the first stage, based on the average amplitude symmetry constraint, a global T2 value of the object is estimated from acquired data and thus the amplitude frequency response function of the effective T2 distortion filter is determined. The Weiner filter is then used to make global T2 amplitude restoration and noise suppression in K-space. In the second stage, linear prediction is utilized to obtain local signal amplitude and phase estimates. That is, Weiner filter processed K-space signals are Fourier-transformed in the read-out direction to obtain a hybrid domain signal and LP is used to provide estimates of local signal amplitude and phase. These estimates are used to make local amplitude and phase corrections in the hybrid domain and thus reduce the effects caused by discontinuities of the T2 distortion filter frequency response. As a result of this two-stage processing, T2 effects on the image data can be reduced and, at the same time, measurement noise can also be suppressed.

DETAILED DESCRIPTION OF EXEMPLARY EMBODIMENTS

Figure 1:
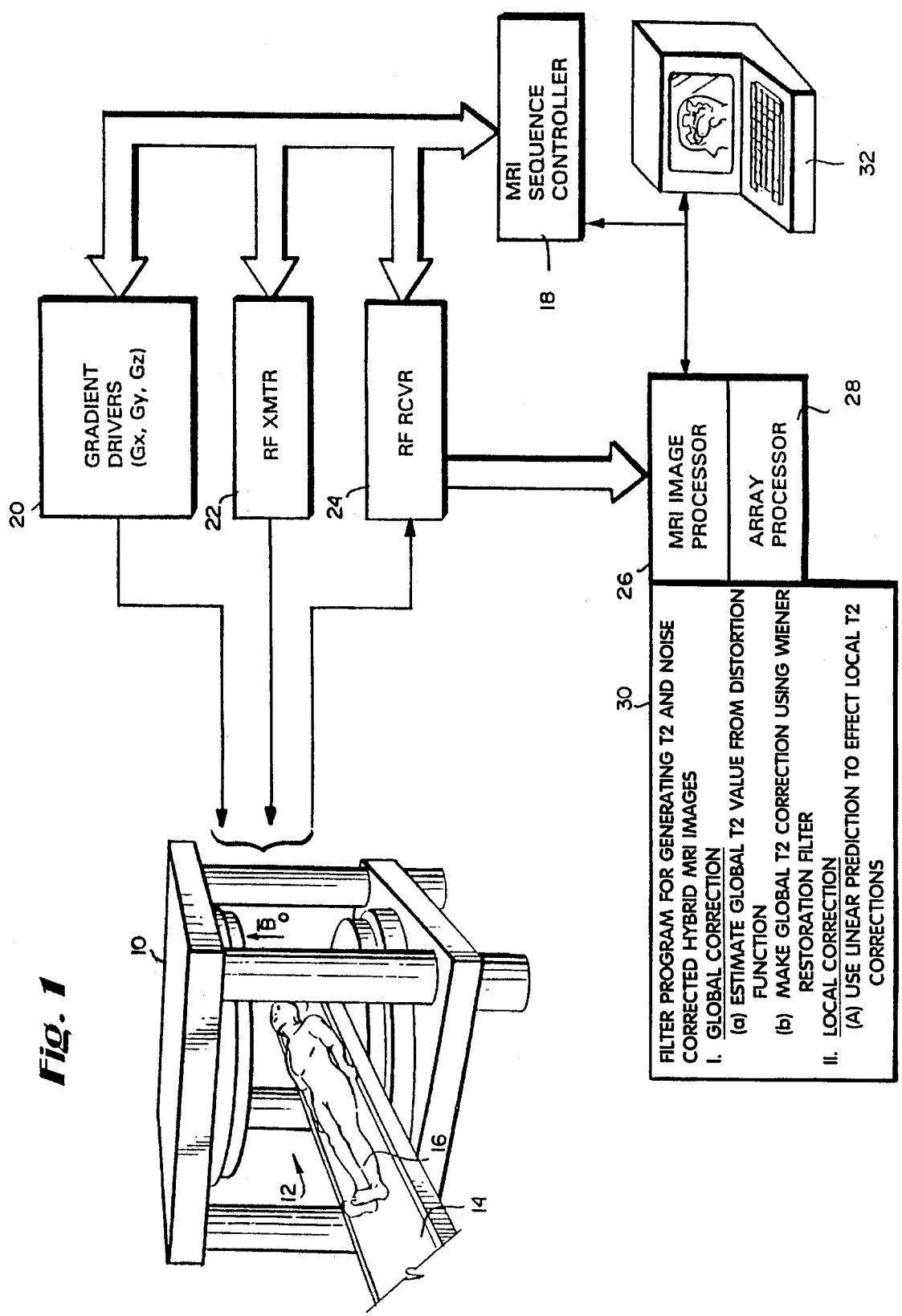
FIG. 1 is a schematic diagram of a conventional MRI system modified so as to practice an exemplary embodiment of this invention.

FIG. 1 depicts a typical conventional MRI system that has been adapted so as to practice an exemplary embodiment of this invention. One example of such system is the Toshiba ACCESS™ MRI system. For example, it may comprise a rather large NMR polarizing magnet structure 10 which generates a substantially uniform homogeneous NMR polarizing magnetic field $B_0$ within a patient imaging volume 12. A suitable carriage 14 is used for inserting the desired portion of patient 16 anatomy within the image volume 12. Magnetic NMR gradients in $B_0$ can be selectively created by electromagnet gradient coils, NMR RF mutation pulses can be transmitted into the patient tissue within the image volume and NMR RF responses can be received from the patient tissue via suitable RF coil structures as will be appreciated by those in the art. A particular MRI data acquisition sequence of such magnetic gradient pulses, RF nutation pulses and NMR RF responses is conventionally achieved by an MRI sequence controller 18 controlling the usual array of gradient drivers 20. RF transmitter circuits 22 and RF receiver circuits 24, all suitable interfaced with electromagnetic and RF coils within the MRI system gantry. The received NMR RF responses are digitized and passed to an MRI image processor 26 which typically includes an array processor 28 and suitable computer program storage media 30 (e.g., RAM in silicon or magnetic media) wherein programs are stored and selectively utilized so as to control the processing of acquired MR image data to produce digitized image displays on the CRT terminal 32. The control terminal 32 may also include suitable keyboard switches and the like for exerting operator control over the MRI sequence controller 18 and the interconnected cooperating MR image processor 26.

In conjunction with the usual MRI processor 26, an operator is typically presented with a menu of choices. In the exemplary embodiment of this invention, one of those choices available to the operator would be "enhancement" or filtering of a hybrid MR image. In the preferred exemplary embodiment, a default set of filter parameters is provided for general usage. However, if desired, different sets of filter parameters may be chosen (possibly from a predetermined array of filter parameter sets) so as to provide the operator with some filtering alternatives that may provide better results in the case of a particular type of medical image.

T2 effects on the quality of conventional MR images have been analyzed in many papers. The effects of T2 amplitude distortions on the HI images have also been investigated and reported in R. T. Constable and J. C. Gore, "The Loss of Small Objects in Variable TE Imaging: Implications for FSE, RARE, and EPI" *Magne. Reson. Med.*, Vol. 28, pp. 9–24, 1992; D. A. Ortendahl, L. Kaufman and D. M. Kramer, "Analysis of Hybrid Imaging Techniques," *Magne. Reson. Med.*, Vol. 26, pp. 155–73, 1992. The frequency responses of the effective T2 distortion filters and their effects on HI image quality continue to be of concern. Ringing artifacts introduced by discontinuities in the T2 filter frequency response are also of concern.

It is well known that MR images depend on multiple tissue parameters: the hydrogen density N(H), the longitudinal and transverse relaxation times, T1 and T2, and the pulse sequence parameters: repetition time TR and echo time TE. [D. A. Ortendahl and N. M. Hylton, "MRI Parameter Selection Techniques," in *Magnetic Resonance Imaging*, edited by C. L. Partian et. al., W. B. Saunders Company, 1988]. For example given a certain shaped object of uniform N(H), T1 and T2, the K-space MR signal $\bar{S}(k_x,k_y)$ acquired in a conventional spin-echo experiment can be written as $$\bar{S}(k_x, k_y) = \sum_{n_x}\sum_{n_y} s(n_x, n_y)e^{-i2\pi(k_x n_x + k_y n_y)} \quad (1)$$

where $s(n_x,n_y)$ is the observable magnetization from the object and $(k_x,k_y)$ are spatial frequencies. Using the tissue parameters and the sequence parameters, equation (1) can also be expressed as $$\bar{S}(k_x,k_y) = N(H)(1-e^{-TR/T1})e^{-TE/T2}\hat{S}(k_x,k_y) \quad (2)$$

where the signal $\hat{S}(k_x,k_y)$ is determined only by the position, size and shape of the object. From equation (2), it can be seen that if TR and TE are fixed constants for different phase encode echoes (different $k_y$ values), there is no image distortion except for a fixed attenuation. In fact, along the frequency encoding ($k_x$) direction, there is also a T2 distortion factor of $e^{-TS(k_x)/T2}$ such that $\bar{S}(k_x,k_y)$ should be written as $$\bar{S}(k_x,k_y) = N(H)(1-e^{-TR/T1})e^{-(TS(k_x)+TE)/T2}\hat{S}(k_x,k_y) \quad (3)$$

with $TS(k_x)$ being the corresponding time for the sampling position $k_x$. In practice, the durations of echoes are usually short compared to T2 times, so this effect is not visually apparent. [D. A. Ortendahl, L. Kaufman and D. M. Kramer, "Analysis of Hybrid Imaging Techniques," *Magne, Reson. Med.*, Vol. 26, pp. 155–73, 1992]

When hybrid MR imaging techniques are used, different echoes in the echo train have different echo times $TE(k_y)$. Then, the acquired signal becomes $$\bar{S}(k_x,k_y) = N(H)(1-e^{-TR/T1})e^{-(TS(k_x)+TE(k_y))/T2}\hat{S}(k_x,k_y) \quad (4)$$

We can rewrite equation (4) as $$\bar{S}(k_x,k_y) = H(k_x,k_y)S(k_x,k_y) \quad (5)$$

where $S(k_x,k_y)$ is the K-space signal without T2 distortion $$S(k_x,k_y) = N(H)(1-e^{-TR/T1})\hat{S}(k_x,k_y) \quad (6)$$

and $H(k_x,k_y)$ is the frequency response of the effective T2 distortion filter defined as $$H(k_x,k_y) = e^{-(TS(k_x)+TE(k_y))/T2} \quad (7)$$

Thus, the effective T2 distortion filter equation (7) is separable in $k_x$ and $k_y$ directions. [D. E. Dudgeon and R. M. Mersereau, *Multidimensional Digital Signal Processing*, Prentice hall, Englewood Cliffs, N.J. 07632, 1981]. That is, it can be written as $$H(k_x,k_y)=e^{-(TS(k_x)/T2}e^{-TE(k_y)/T2}=H_x(k_x)H_y(k_y) \quad (8)$$

where $$H_x(k_x)=e^{-TS(k_x)/T2}, H_y(k_y)=e^{-TE(k_y)/T2} \quad (9)$$

This fact is useful for simplifying implementation of the T2 correction filter in practice. [D. E. Dudgeon and R. M. Merserean, *Multidimensional Digital Signal Processing*, Prentice Hall, Englewood Cliffs, N.J. 07732, 1981]. In MR imaging systems, noise results from multiple sources but it essentially consists of two major components: noise from the receiver circuits and noise from the excited tissues. These two components are affected by the system resonance frequency but are independent of echo times. Therefore, the T2 filter equation (7) has an effect on the signal but not on noise. [R. T. Constable and J. C. Gore, "The Loss of Small Objects in Variable TE Imaging: Implications for FSE, RARE, and EPI," *Magne, Reson. Med.*, Vol. 28, pp. 9–24, 1992; D. A. Ortendahl, L. Kaufman and D. M. Kramer, "Analysis of Hybrid Imaging Techniques," *Magne., Reson. Med.*, Vol. 26, pp. 155–73, 1992].

In the above formula for the T2 filter, absolute times $TS(k_x)$ and $TE(k_y)$ are used for the data sample $\bar{S}(k_x,k_y)$. For the purpose of explanation in the following discussion, relative times will be used for equation (7). In addition, it will be assumed that $TS(k_x)=0$ for the first sample in the frequency encoding direction and $TE(k_y)=0$ for the first echo in the echo train. This will normalize the T2 filter such that $H(k_x,k_y)_{max}=1.0$ but will not change the shapes of the frequency responses of the T2 distortion filter and therefore will not affect the structure of the resulting T2 correction filter.

Figure 2:
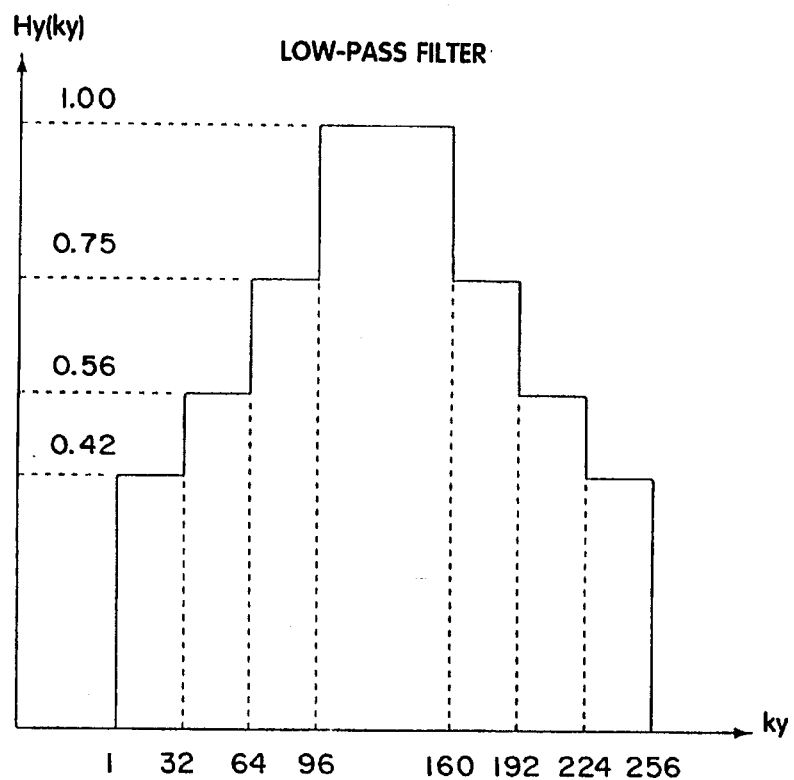
FIG. 2 depicts the frequency response of a low-pass T2 filter.
Figure 3:
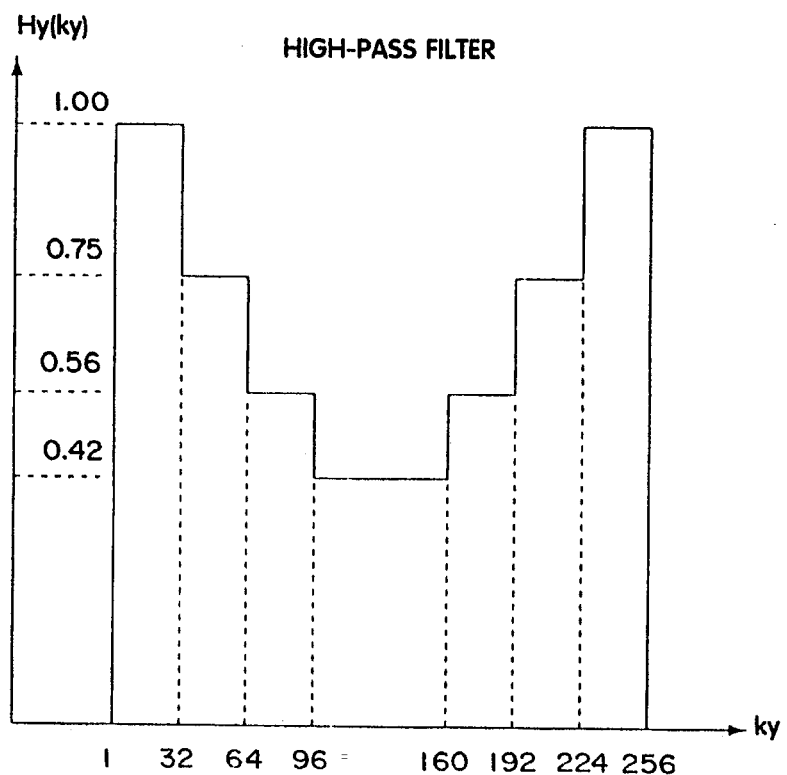
FIG. 3 depicts the frequency response of a high-pass T2 filter.

Depending on the phase encoding schemes chosen, the T2 filter can have different frequency responses and thus have different effects on the resulting HI images. Consider, for instance, an M excitation HI sequence, each M containing N phase-encoded echoes to form an MN-line acquisition. If the earliest echo is assigned to the lowest spatial frequencies, with later echoes assigned to progressively higher spatial frequencies, the T2 filter has a low-pass frequency response in the $k_y$ direction. In this case, the image spatial resolution will be reduced. This case is similar to the blurring problems in many other imaging systems. On the other hand, if the earliest echo is assigned to the highest spatial frequencies, with later echoes assigned to progressively lower spatial frequencies, T2 filter has a high-pass frequency response in $k_y$ direction. Then, some edge enhancement may occur but the image contrast of large areas will be attenuated. In FIGS. 2 and 3 are shown the frequency responses $H_y(k_y)$ of low-pass T2 filter and a high-pass T2 filter, respectively, for two HI sequences with M=64 and N=4. the object is assumed to have a T2 value of 70(ms). The echo times TE(i)=20.i ms are used for the echo number i=1,2,3,4, respectively, in the echo train. In these figures and the following discussions, the position of $k_y=129$ corresponds to the zero-phase encode projection.

Figure 4:
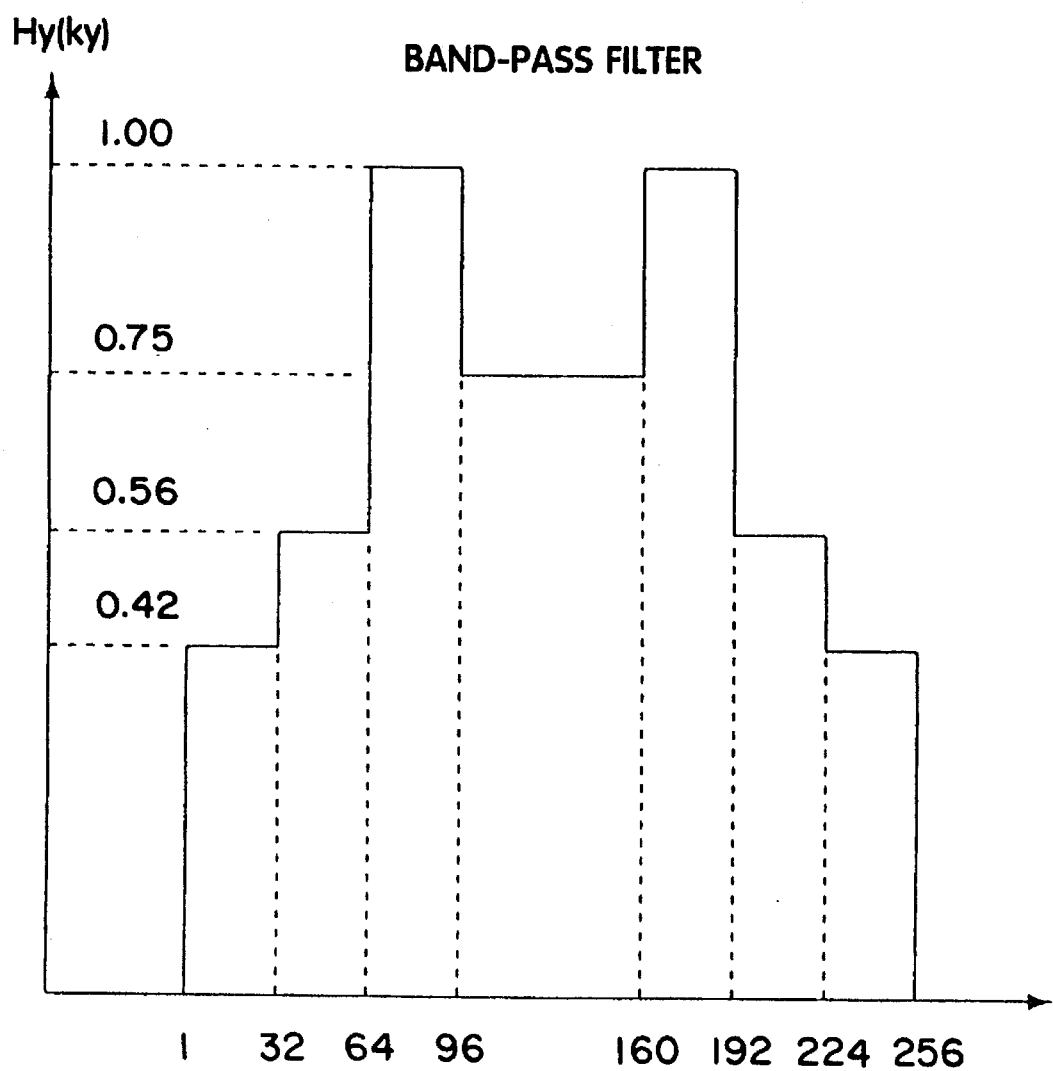
FIG. 4 depicts the frequency response of a band-pass T2 filter.

The T2 filter can also have frequency responses of band-pass, ramp and other shapes by using different sequence specifications. [R. T. Constable and J. C. Gore, "The Loss of Small Objects in Variable TE Imaging: Implications for FSE, RARE, and EPI," *Magne, Reson. Med.*, Vol. 28, pp. 9–24 1992; D. A. Ortendahl, L. Kaufman and D. M. Kramer, "Analysis of Hybrid Imaging Techniques," *Magne., Reson. Med.*, Vol. 26, pp. 155–73, 1992]. In FIG 4 is shown the frequency response of a band-pass T2 filter where the projections from the first echo are located in the middle frequency band. This encoding scheme has a better trade-off for image resolution and contrast that the low-pass and the high-pass encoding schemes. However, it usually generates more ringing artifacts because of the existence of bigger jumps in the frequency response shown in FIG. 4 than those shown in FIGS. 2 and 3. Note that for different phase encoding schemes, the T2 filter $H_x(k_x)$ in the $k_x$ direction always has an exponential ramp frequency response.

Figure 5B:
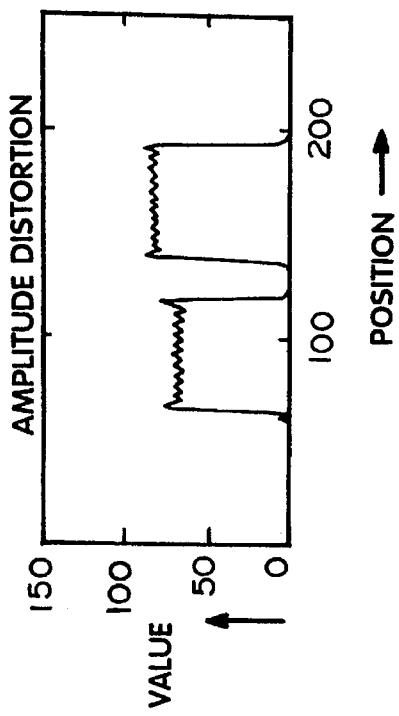
FIGS. 5A–5D depict the effects of T2 amplitude and phase distortion.
Figure 5D:
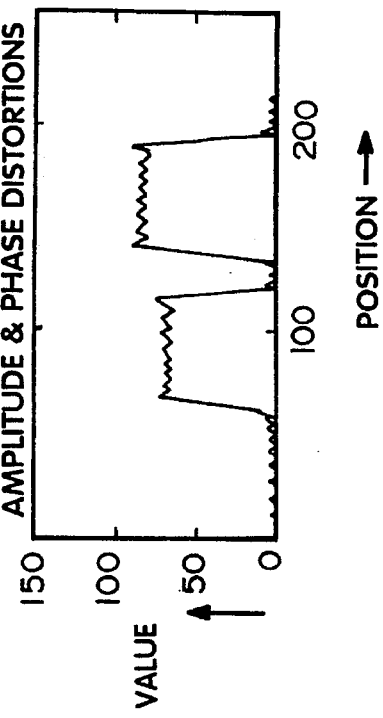
Figure 5A:
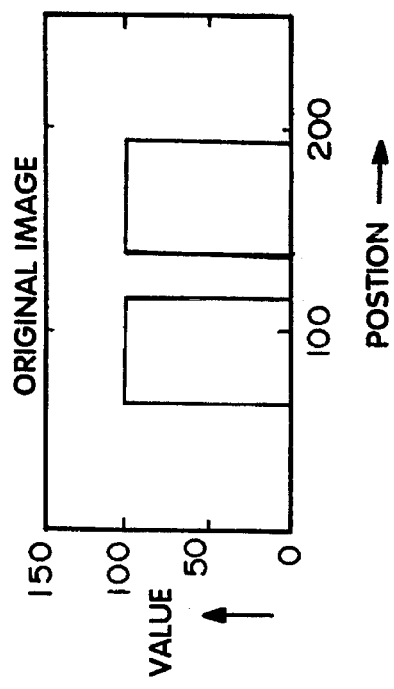
Figure 5C:
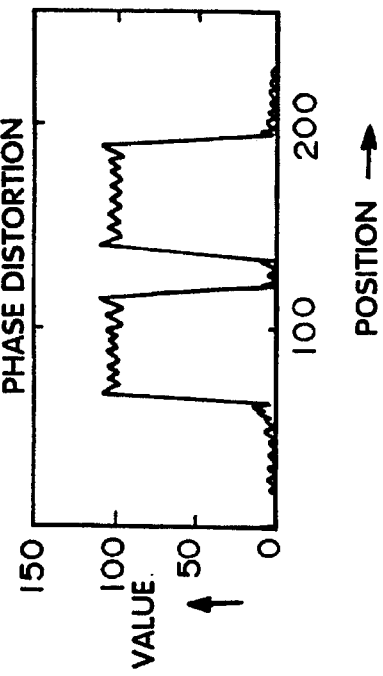

In the above, only the amplitude frequency responses of T2 distortion filters is considered. It is known that for image representation, the phase components of an image Fourier transform often have a more important role than the amplitude components. [M. H. Hayes, "The Reconstruction of a Multidimensional Sequence from the Phase or Magnitude of Its Fourier Transform," IEEE *Trans.* ASSP., Vol. 30, No. 2, pp. 140–54, 1982]. In MR imaging, in addition to amplitude distortions introduced by T2 effects, due to the imperfection of the practical imaging system and the difficulty of exact phase control in the HI sequence, there are also phase distortions caused by different phase shifts to the signal components from different echoes. These phase distortions will also generate ringing artifacts (even if there were no T2 amplitude distortions). Furthermore, the amplitude and phase discontinuities introduced by the T2 effects are signal dependent and thus cannot be smoothed by simple windowing. In FIG. 5A, the original image of two rectangular objects is shown, the image is shown with amplitude distortion only in FIG. 5B, the image with phase distortion only is shown in FIG. 5C, and the image with both amplitude and phase distortions is shown in FIG. 5D. The ampitude distortion is caused by an effective T2 distortion filter with a frequency response similar to that shown in FIG. 4. The phase distortion is caused by 90° phase shift to the signal components from the second echo. The periods of these ringing artifacts are determined by the positions of the discontinuities in the T2 distortion filter frequency response. For the example of FIGS. 5A–5D, there is a big discontinuity in $k_y$ at position 96 which corresponds to the digital frequency $f\approx0.13$. Therefore, the period of the major ringing artifacts is about 7.7 pixels in this image of 256 pixels. These ringing artifacts seriously disturb accurate diagnosis using HI MR images. To improve the HI image quality, both the amplitude and phase distortions should be reduced.

In the previous discussion, one object with uniform tissue parameters has been assumed. In practice, an object under study usually has complicated distributions of these tissue parameters and the T2 values vary in different regions of the object. Signals from these different tissues are first distorted by the corresponding T2 distortion filters and then added together, further contaminated by measurement noise. Therefore, complete T2 correction is a challenging task. Nevertheless, as explained below, the use of a Wiener filter to make a global T2 amplitude correction (based on an estimated frequency response $H(k_x,k_y)$ from the acquired data) provides a major improvement.

As previously shown, the T2 effects on images can be modeled as an original image distorted by a T2 distortion filter. If the frequency response of the T2 distortion filter is known, inverse filtering can recover the original image from the acquired data. That is, $$S(k_x,k_y)=H'(k_x,k_y)\bar{S}(k_x,k_y) \quad (10)$$

where the frequency response $H'(k_x,k_y)$ of the inverse filter is the reciprocal of the frequency response of the T2 filter and can be written using equation (7) as $$H^I(k_x, k_y) = \frac{1}{H(k_x, k_y)} = e^{(TS(k_x)+TE(k_y))/T2} \quad (11)$$

The main problem with the inverse filter is its sensitivity of measurement noise. When the acquired data $\bar{S}(k_x,k_y)$ is in the form of the T2 distorted signal plus noise, which is the case in any practical imaging system, we have $$\bar{S}(k_x, k_y) = H(k_x,k_y)S(k_x,k_y) + N(k_x,k_y) \quad (12)$$

where $N(k_x,k_y)$ is the measurement noise component. Then the inverse filter will give $$\hat{S}(k_x, k_y) = H^I(k_x, k_y)\bar{S}(k_x, k_y) = \quad (13)$$

$$S(k_x, k_y) + \frac{N(k_x, k_y)}{H(k_x, k_y)} = S(k_x, k_y) + \hat{N}(k_x, k_y)$$

Since the noise component $N(k_x,k_y)$ is not affected by the T2 filter and $H(k_x,k_y)<1$, we have $\hat{N}(k_x,k_y)>N(k_x,k_y)$. The measurement noise will be amplified in this T2 correction process and the resulting images are often not acceptable.

The Wiener algorithm provides a better solution to the T2 correction problem in a noisy environment. Let the signal $s(n_x,n_y)$ and the noise $n(n_x,n_y)$ be arbitrary, zero mean, random sequences, respectively. If the acquired sequence $\bar{s}(n_x,n_y)$ is modeled as $$\bar{s}(n_x,n_y) = h(n_x,n_y)**s(n_x,n_y) + n(n_x,n_y) \quad (14)$$

where $h(n_x,n_y)$ is the distortion filter and II denotes 2-D convolution, then the best linear estimate $\ddot{s}(n_x,n_y)$ for the original signal $s(n_x,n_y)$ can be obtained from the distorted data $\bar{s}(n_x,n_y)$ using a Wiener filter $w(n_x, n_y)$ in the sense that the mean square error between the original signal $s(n_x,n_y)$ and the estimated signal $\ddot{s}(n_x,n_y)$ defined by $$\sigma_w^2 \epsilon[|e_w(n_x,n_y)|] = \epsilon[|s(n_x,n_y) - \ddot{s}(n_x,n_y)|^2] \quad (15)$$

is minimized where $\epsilon$ represents the expectation operation. The Wiener restoration filter $w(n_x,n_y)$ has a frequency response $W(k_x,k_y)$ in the form $$W(k_x, k_y) = \frac{H^*(k_x, k_y)P_{ss}(k_x, k_y)}{|H(k_x, k_y)|^2 P_{ss}(k_x, k_y) + P_{nn}(k_x, k_y)} \quad (16)$$

where $H(k_x,k_y)$ is the frequency response of the distortion filter $h(x,y)$ and the superscript * represents conjugation. $P_{ss}(k_x,k_y)$ and $P_{nn}(k_x, k_y)$ are the power spectrums of the signal process $s(x,y)$ and the noise process $n(x,y)$, respectively. [R. C. Gonzalez and P. Wintz, *Digital Image Processing*, Addison-Wesley Publishing Company, 1988; A. K. Jain, *Fundamentals of Digital Image Processing*, Prentice Hall, Englewood Cliffs, N.J. 07632, 1989] The restoration process of the Wiener filter is adjusted adaptively by the local signal-to-noise ratio $P_{ss}(k_x,k_y)/P_{nn}(k_x,k_y)$. In the small noise case, $P_{nn}(k_x,k_y) \approx 0.0$, the Wiener filter reduces to the inverse filter $$W(k_x, k_y) \approx \frac{1}{H(k_x, k_y)} = H^I(k_x, k_y) \quad (17)$$

and distortion effects can be removed. If the T2 effects are very weak such that $H(k_x,k_y) \approx 1.0$ as in conventional (i.e., non-hybrid) MR sequence cases, then the Wiener filter becomes $$W(k_x, k_y) \approx \frac{P_{22}(k_x, k_y)}{P_{ss}(k_x, k_y) + P_{nn}(k_x, k_y)} \quad (18)$$

which smooths the image data. When both T2 effects and noise exist, the Wiener filter reduces T2 effects and, at the same time, suppresses measurement noise.

In MR imaging, the power spectrums of the signal and of the noise are not known and thus have to be estimated from the acquired data. Since $\bar{S}(k_x,k_y)$ is the inverse Fourier transform of the object, it usually has smaller values at higher spatial frequencies and thus the noise is often dominant in these frequencies. This will be especially true for hybrid fast MR imaging using a low-pass scheme since longer echo times further attenuate these high frequency signal components. Therefore, the average noise power $\bar{P}_{nn}$ can be rather accurately estimated from the data $\bar{S}(k_x,k_y)$ on a support $S_n$ in the high spatial frequencies from the latest echo in the echo train using the standard formula $$\bar{P}_{nn} = \frac{1}{N_p} \underset{(k_x,k_y) \in S_n}{\Sigma \Sigma} |\bar{S}(k_x, k_y)|^2 \quad (19)$$

where $N_p$ is the total data number used for the $\bar{P}_{nn}$ estimation on the data support $S_n$. Since the measurement noise $N(k_x, k_y)$ is often assumed to be white, we have the same noise power $\bar{P}_{nn}$ everywhere in K-space. In practice, some DC component may exist. In this case, any such DC should be removed before making the estimation by equation (19).

Then the periodogram spectral estimation is used to obtain an estimate of the spectrum of the image data. [S. M. Kay, *Modern Spectral Estimation: Theory & Application*, Prentice Hall, Englewood Cliffs, N.J. 07632, 1988] That is, we use the local data power $\bar{P}_{dd}(k_x,k_y)$ defined by $$\bar{P}_{dd}(k_x,k_y) = |\bar{S}(k_x,k_y)|^2 \quad (20)$$

to replace the signal power spectrum $P_{ss}(k_x,k_y)$ in equation (16) and thus obtain the frequency response of K-space Wiener T2 correction filter is $$\bar{W}(k_x, k_y) = \frac{H(k_x, k_y)\bar{P}_{dd}(k_x, k_y)}{H^2(k_x, k_y)\bar{P}_{dd}(k_x, k_y) + \bar{P}_{nn}} \quad (21)$$

Since the frequency response $H(k_x,k_y)$ of the T2 distortion filter is real in our discussion, the conjugate operation (*) and the absolute value operation ($|\cdot|$) have been dropped in equation (21). The signal power can also be estimated by $$\hat{P}_{dd}(k_x,k_y) = \max\{(|\bar{S}(k_x,k_y)|^2 - \bar{P}_{nn}), 0.0\} \quad (22)$$

This can be used in equation (21) instead of $\bar{P}_{dd}(k_x,k_y)$ and will, in general, give stronger noise suppression. Once the frequency response of the Wiener filter is determined, the restored K-space image data can be obtained as $$\check{S}(k_x, k_y) = W(k_x, k_y)\bar{S}(k_x, k_y) = \quad (23)$$

$$\frac{H(k_x, k_y)\bar{P}_{dd}(k_x, k_y)}{H^2(k_x, k_y)\bar{P}_{dd}(k_x, k_y) + \bar{P}_{nn}} \bar{S}(k_x, k_y)$$

One approach to determine the frequency response function $H(k_x,k_y)$ from the acquired data is described below and from this the Wiener filter equation (21) can be complete specification for the image data restoration.

Since the frequency response $H(k_x,k_y)$ of the T2 distortion filter depends on the spatial distribution and spin density of T2 values within the object under study, one cannot determine the exact frequency response of the T2 filter with just one data acquisition. Nevertheless, one approach for estimating $H(k_x,k_y)$ from the acquired data based on the average amplitude symmetry constraint of the spin echo signal is set forth below.

It is well known from MR spectroscopy that the time-domain echo signal is symmetric around its peak if the T2 value is much longer than the echo observation time. In MR imaging, when the same TE is used for all phase encode ($k_y$) values, ideally, the K-space data $S(129+k_x,129+k_y)$ and $S(129-k_x,129-k_y)$ should be conjugate symmetric about the peak signal position ($k_x=129, k_y=129$) in a 256×256 data matrix and have the same amplitude values if the T2 values of the object are much longer than the sampling window width in the frequency encoding (read-out, $k_x$) direction. [D. A. Feinberg, J. D. Hale, J. C. Watts, L. Kaufman and A. Mark, "Halving MR Imaging Time by Conjugation: Demonstration at 3.5 kG." *Radiology* 164, pp. 527–31, 1986] When the T2 distortion effect exists, data amplitude distributions are biased. Therefore, one can estimate a global T2 value from the acquired data using this symmetric constraint.

Figure 6:
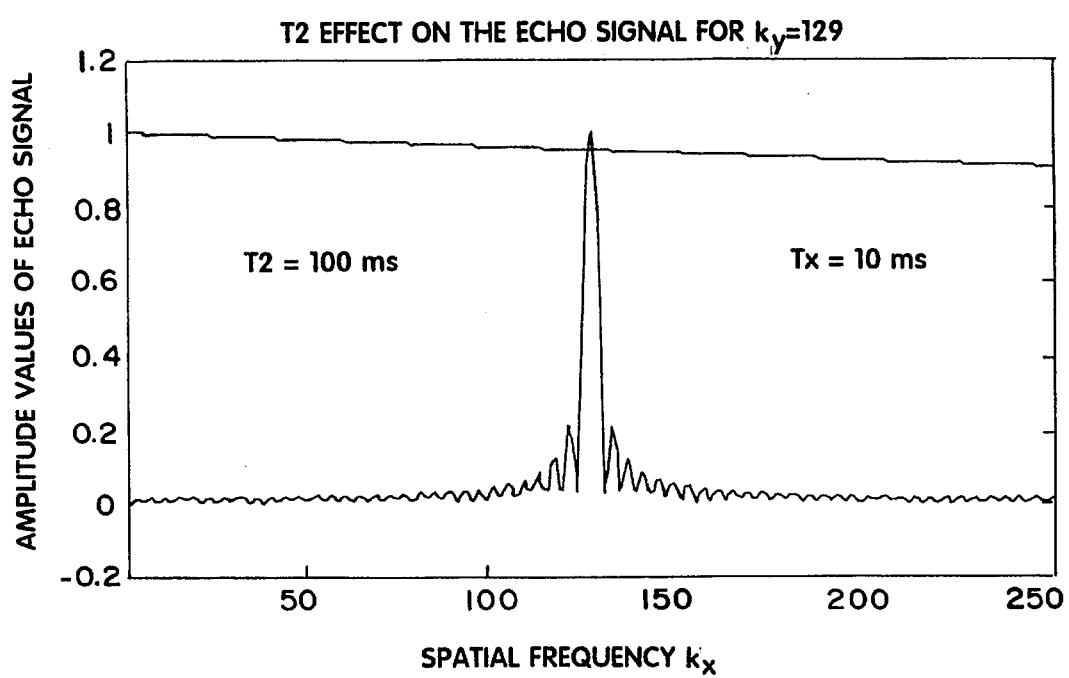
FIG. 6 represents the estimation of a global T2 value.

In FIG. 6 is shown a profile of the K-space data $|\bar{S}(k_x,129)|$ for a rectangular object. It is symmetric about and peaked at $k_x=129$. The curve on the top part of FIG. 6 is the exponential function $e^{-t/T2}$ with T2=100 ms and the sampling window width $T_x=10$ ms. If there is no noise and there is only a global T2 effect, any two values of $|\bar{S}(k_x,129)|$ from the two points symmetric about the peak would provide an estimate of the global T2 value. But there are many factors, including measurement noise and phase shifts, which affect the amplitude symmetry property. Therefore, one may first calculate the sums of the acquired signal amplitude $|\bar{S}(k_x,129)|$ over two equal time spans symmetric about the echo peak. For example, if $\bar{S}(k_x,129)$ has $N_x$ samples in the $k_x$ direction with the sampling window time $T_x$, we calculate the average amplitude A1 and A2 over a fraction of $T_x$ as $$A1 = \frac{1}{N_{T2,x}} \sum_{k_x=1}^{N_{T2,x}} |\bar{S}(k_x, 129)|, \quad (24)$$

$$A2 = \frac{1}{N_{T2,x}} \sum_{k_x=N_x-N_{T2,x}+1}^{N_x} |\bar{S}(k_x, 129)|$$

where $N_{T2,x}$ is the number of data samples in the T2 estimate window $T_w$. An average T2 value can be calculated from these two amplitude values as $$T2=(N_x-N_{T2,x})T_p/\ln(A1/A2)) \quad (25)$$

where $T_p$ is the period of the data sampling in the $k_x$ direction and thus $T_x=N_x T_p$. From equation (1), it is known that $$\bar{S}(k_x, 129) = \sum_{n_x}\sum_{n_y} s(n_x, n_y)e^{-i2\pi(k_x n_x + 129 n_y)} \quad (26)$$

and thus the echo signal $\bar{S}(k_x,129)$ is composed of contributions from all elements $s(n_x,n_y)$ of the object. Therefore, (25) provides only a global T2 estimate of the object.

The derivation of equation (25) is based on an assumption that the signal has a flat Fourier spectrum over the T2 estimate window $T_w$. For real signal spectrums with arbitrary shapes, the estimated global T2 will deviate from the true global T2 value and the difference between the true T2 value and estimated T2 value is affected by the width $T_w$ and the shape of the signal spectrum $\bar{S}(k_x,k_y)$. When there is no noise and no phase error, a shorter estimate window generates a smaller estimate difference (bias) from the true T2 value. When there are noise and other disturbing factors, the estimate window cannot be too short. It is the summation (low-pass filtering) process that reduces the disturbing effects such as noise and phase shifts, and helps obtain a stable T2 estimation. This is a typical tradeoff between the bias and the variance in the estimation problem [L. L. Scharf, *Statistical Signal Processing: Detection, Estimation, and Time Series Analysis,* Addison-Wesley Publishing Company, 1990] In practice, the T2 estimate window size $T_w$ should be adjusted according to the MR imaging conditions.

To reduce the effect of spectrum shape on the T2 estimate, one may use a root filtering technique to compress the dynamic range of $\bar{S}(k_x,k_y)$. That is, the two variables A1 and A2 are calculated by $$A1 = \sum_{k_x=1}^{N_{T2,x}} |\bar{S}(k_x, 129)|^\alpha, \quad (27)$$

$$A2 = \sum_{k_x=N_x-N_{T2,x}+1}^{N_x} |\bar{S}(k_x, 129)|^\alpha$$

where the root factor $\alpha(>0)$ determines the degree of compression and a smaller $\alpha$ generates a smoother spectrum. Since the estimated T2 value is affected only by the ratio of A1 and A2, the normalizing factor $1/N_{T2,x}$ used in equation (24) has been omitted in equation (27) above. Then the average T2 value is determined as $$T2=\alpha(N_x-N_{T2,x})T_p/\ln(A1/A2) \quad (28)$$

Some estimated T2 values using equations (27) and (28) are listed in Table 1 below for different values of the T2 estimate window width $T_w$ and the root factor $\alpha$. The time-domain signal has a Sinc shape as shown in FIG. 6 and a T2 value of 100 ms. A sampling window time $T_x=10$ ms has been used. It can be seen that the shorter window $T_w$ and the smaller $\alpha$ provide better estimates for the T2 value.

A1 and A2 could also be calculated over a wider window in $k_y$ direction such that $$A1 = \sum_{k_y=129-N_{T2,y}}^{129+N_{T2,y}} \sum_{k_x=1}^{N_{T2,x}} |\bar{S}(k_x, k_y)|^\alpha, \quad (29)$$

$$A2 = \sum_{k_y=129-N_{T2,y}}^{129+N_{T2,y}} \sum_{k_x=N_x-N_{T2,x}+1}^{N_x} |\bar{S}(k_x, k_y)|^\alpha$$

where $N_{T2,y}$ determines the width ($2N_{T2,y}+1$) of the T2 estimate window in the $k_y$ direction. When $N_{T2,y}=0$, equation (29) reduces to equation (27). After a global T2 value has been estimated, the frequency response $H(k_x,k_y)$ of the T2 distortion filter can be determined using equation (7), according to the MR sequence specification of echo times $TE(k_y)$ and the data sampling period $T_p$.

TABLE 1

Estimated T2 Values Using Different Values of $T_w$ and $\alpha$
T2 = 100.00 ms, $T_x$ = 10.00 ms

| $T_w$ | $\alpha$ | | | |
|---|---|---|---|---|
| | 2.00 | 1.00 | 0.50 | 0.25 |
| $T_x/4$ | 109.65 ms | 105.22 ms | 102.75 ms | 104.44 ms |
| $T_x/8$ | 102.85 ms | 104.89 ms | 101.15 ms | 100.64 ms |
| $T_x/16$ | 104.76 ms | 104.32 ms | 100.84 ms | 100.48 ms |

The approach discussed above makes the estimation of $H(k_x,k_y)$ from the acquired image data directly and thus does not require extra data acquisition. But this approach can only estimate the amplitude distortion function of the T2 filter and therefore the resulting Weiner filter based on these estimates can only reduce the amplitude distortion caused by the T2 effect.

Linear prediction techniques have been successfully used for time-series analysis, high resolution spectrum estimation, speech and image signal coding, and many other applications [S. M. Kay, *Modern Spectral Estimation: Theory & Application,* Prentice Hall, Englewood Cliffs, N.J. 07632, 1988] The technique has also been used for MR data extrapolation to reduce the truncation artifacts and improve spatial resolution [M. R. Smith, S. T. Nichols, R. M. Henkelman and M. L. Wood, "Application of Autoregressive Moving Average Parametric Modeling in Magnetic Resonance Image Reconstruction," IEEE *Trans Med., Imag.,* Vol. 5, pp. 132–39, 1986; J. F. Martin and C. F. Tirendi, "Modified Linear Prediction Modeling in Magnetic Resonance Imaging," *J. Magn. Reson,* Vol. 82, pp. 392–99, 1989; E. M. Haacke, Z. Liang and S. H. Izen, "Super Resolution Reconstruction Through Object Modeling and Parameter Estimation," IEEE *Trans.* ASSP., Vol. 37, pp. 392–95, 1989]. the application of linear prediction to local T2 correction of both amplitude and phase distortions is discussed below.

Given p observed data samples x(n),x(n+1) ... x(n+p-1), the unobserved data sample x(n+p) can be predicted using one-step forward linear prediction as $$\hat{x}(n+p) = -\sum_{k=1}^{p} \alpha_k x(n+p-k) \qquad (30)$$

Similarly, the unobserved data sample x(n−1) can be predicted using one-step backward linear prediction as $$\hat{x}(n-1) = -\sum_{k=1}^{p} \beta_k x(n+p-k) \qquad (31)$$

In both cases, the predicted data sample is a linear combination of the p observed samples. In accordance with the Wiener filter, forward prediction coefficients $\{\alpha_1, \alpha_2 \ldots \alpha_p\}$ and backward prediction coefficients $\{\beta_1, \beta_2 \ldots \beta_p\}$ are chosen to minimize the mean square error between the original signal x(n) and the predicted signal $\hat{x}(n)$ $$\alpha_p^2 = \epsilon[|e_p(n)|^2] = \epsilon[|x(n)-\hat{x}(n)|^2] \qquad (32)$$

In fact, Wiener filter coefficients and linear predictor coefficients are both defined by the Wiener-Hopf equations. [S. Haykin, *Adaptive Filter Theory,* Second Edition, Prentice Hall, Englewood Cliffs, N.J. 07632, 1991] There are several methods that may be used for determination of the coefficients of a linear predictor. For example, the autocorrelation method may be desirable because the resulting predictor is guaranteed to be stable and the very efficient Levinson-Durbin algorithm can be used for determination of the predictor coefficients. [L. B. Jackson, *Digital Filters and Signal Processing,* Second Edition, Kluwer Academic Publishers, 1989; S. Haykin, *Adaptive Filter Theory,* Second Edition, Prentice Hall, Englewood Cliffs, N.J. 07632, 1991]

Assume that the global T2 corrected MR data by the Wiener filter are represented by a 2-D function $\check{S}(k_x,k_y)$ where $k_x$ is the index of sampling points in the frequency encode direction and $k_y$ is the index of sampling points in the phase encode direction. First, the inverse Fourier transform of the time-domain data $\check{S}(k_x, k_y)$ is taken with respect to $k_x$ to obtain the hybrid-domain data set $X(n_x,k_y)$ and then the data $X(n_x,k_y)$ is considered for each $n_x$ value. Given the discontinuity positions in the frequency response of T2 distortion filters, the linear prediction is used to produce data samples across these positions. For example, if the T2 distortion filter is as shown in FIG. 2, a total of 31 data samples from $X(n_x, 130)$ to $X(n_x, 160)$ can be used to predict data samples on the other side of the discontinuity position by forward linear prediction, starting from $k_y=161$. The prediction is performed from data samples of lower frequency to data samples of higher frequency since low frequency data samples usually have higher signal-to-noise ratio and therefore the resulting predicted data have lower prediction errors.

From the old data sample $X(n_x,161)$ and the first predicted sample $\check{X}(n_x,161)$, the local phase distortion factor can be estimated as $$\psi(n_x) = \text{phase}[\check{X}(n_x,161)] - \text{phase}[X(n_x,161)] \qquad (33)$$

This local phase distortion factor is then used to make a local zero-order phase correction by multiplying all the old data samples of the second echo from $k_y=161$ to $k_y=192$. The resulting phase corrected data are denoted as $\hat{X}(n_x,k_y)$. That is $$\hat{X}(n_x,k_y) = \exp(+i\psi(n_x)) \cdot X(n_x,k_y) \text{ for } 161<k_y<192 \qquad (34)$$

The estimated local phase distortion factor $\psi(n_x)$ from different column data $X(n_x,k_y)$ can be first low-pass filtered and the resulting smoothed phase estimates are then used in equation (34) for phase correction. This enhances the stability of local phase correction.

Since the prediction usually has quite precise results for data samples close to the starting position ($k_y=161$) in the echo train boundary and becomes less accurate as $k_y$ moves away from the boundary, predicted data $\check{X}(nx,k_y)$ are combined with zero-order phase corrected data $\hat{x}(n_x,k_y)$ as a weighted average over a data merging band to obtain local amplitude and phase corrected data $\overline{X}(n_x,k_y)$. That is, $$\overline{X}(n_x,k_y) = w_1(k_y)\check{X}(n_x,k_y) + w_2(k_y)\hat{X}(n_x,k_y) \text{ for } 161<k_y<(161+N_m) \qquad (35)$$

where $N_m$ is the width of the data merging band. Two weighting factors $w_1(k_y)$ and $w_2(k_y)$ are some monotonously decreasing and increasing functions of $k_y$, respectively. They are related as $w_1(k_y)+w_2(k_y)=1.0$ for all $k_y$. The use of these weighting functions are intended to ensure a smooth transition from the predicted data to the originally observed data. In this study, $w_1(k_y)$ and $w_2(k_y)$ are chosen as linear functions of $k_y$ and thus $$\overline{X}(n_x, k_y) = \frac{N_m - (k_y - 161)}{N_m} \check{X}(n_x, k_y) + \frac{k_y - 161}{N_m} \hat{X}(n_x, k_y) \qquad (36)$$

for $161 \leq k_y \leq (161 + N_m)$

Although other weighting functions such as quadratic and exponential functions have been tried to make different weightings on the two data sets, it has been found that they do not make a significant performance difference. The determination of the data merging band $N_m$ is affected by several considerations. A wider merging band usually provides stronger ringing artifact reduction but it also results in bigger changes in the original signal spectrum. Also, its value is limited by the data number in each echo group. A band around ten data samples gives good results for four-echo HI images of 256 phase encoding projections.

A similar local amplitude and phase correction is performed around other discontinuity positions in the data set $X(n_x,k_y)$ except that for the discontinuity positions of $k_y<129$, a backward linear prediction is used to estimate data samples across these positions (based also on the data samples with lower frequencies). Finally, the inverse Fourier transform of the hybrid domain data $\tilde{X}(n_x,k_y)$ is taken with respect to $k_y$ to reconstruct the HI image. As shown by the subsequently discussed examples, this processing effectively reduces effects from amplitude and phase discontinuities in the frequency response of the effective T2 distortion filter and therefore reduces ringing artifacts in the reconstructed HI image.

Figure 7A:
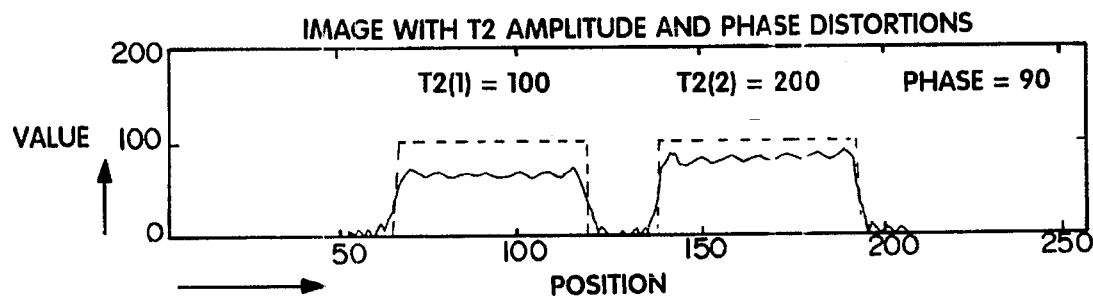
FIGS. 7A–7D depict one dimensional images before and after T2 corrections.
Figure 7B:
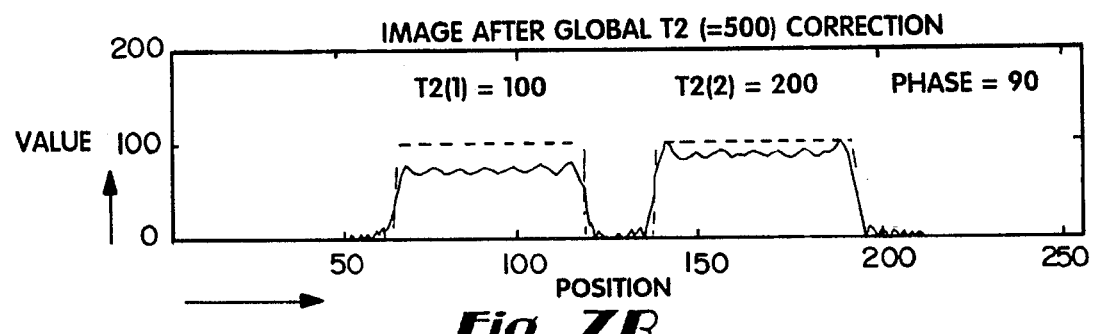

First, a one-dimensional image consisting of two rectangular objects with T2 values of 100 ms and 200 ms respectively is considered. A sequence with the band-pass T2 filter response defined in FIG. 4 has been used for data generation. The echo times of four echoes are TE(i)=20.i ms for i=1,2, 3,4. It has also assumed that signal components from the second echo have a 90° phase shift with respect to those from the other three echoes. The reconstructed image is shown in FIG. 7A. Comparing with the original image shown by dotted line also in FIG. 7A, it can also be seen that the simulated HI image has amplitude attenuation, resolution loss and serious ringing artifacts. Using a global T2 value of 500 ms in the Wiener restoration filter, amplitude distortions on both objects have been reduced as shown in FIG. 7B. Note that since the noiseless case is now being considered, the Wiener filter is just a simple inverse filter.

Figure 7C:
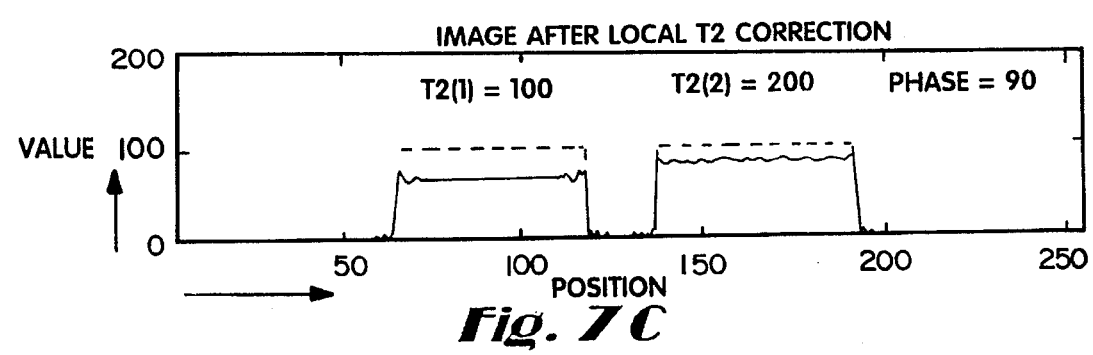

Because the phase error has not been corrected, it is noted that image resolution loss and ringing artifacts still exist. If local amplitude and phase correction is applied to the distorted image data directly, a local corrected image is obtained as shown in FIG. 7C with improved resolution and reduced ringing artifacts. In this case, 30 data samples were used to calculate the autocorrelation function (ACF) with a biased ACF estimator [L. B. Jackson, *Digital Filters and Signal Processing,* Second Edition, Kluwer Academic Publishers, 1989] For the predictor order selection, there are many techniques available [S. M. Kay, *Modern Spectral Estimation: Theory & Application,* Prentice Hall, Englewood Cliffs, N.J. 07632, 1988 ] The model order selection rule $N/3<p<N/2$ by Ulrych and Bishop [T. J. Ulrych and T. N. Bishop, "Maximum Entropy Spectral Analysis and Autoregressive Decomposition," *Rev. Geophys. Space Phys.,* Vol. 13, pp. 183–200, 1975] where N is the number of data samples used for the ACF estimation was used here. Therefore, the order p of the linear predictor for this case has been chosen to be 12. The predictor coefficients are determined with the Levinson-Durbin algorithm. The new data samples can be predicted using equations (30) or (31) based on known data samples and previously predicted data samples. The estimated local phase distortion using equation (33) from the forward predicted data $\tilde{X}(161)$ and the old data sample $X(161)$ is 97.15° and the estimated local phase distortion is 92.54° from the backward predicted data $\tilde{X}(96)$ and the old data $X(96)$. The phase estimate error is less than 10%. As described above, these phase estimates are used to make the zero-order phase correction on data of $k_y>161$ and $k_y<96$, respectively. Then the phase corrected data are merged with the estimated data to form a new data set for final image reconstruction. A data merging band of ten data samples has been used for all discontinuity positions in FIG. 4.

Figure 7D:
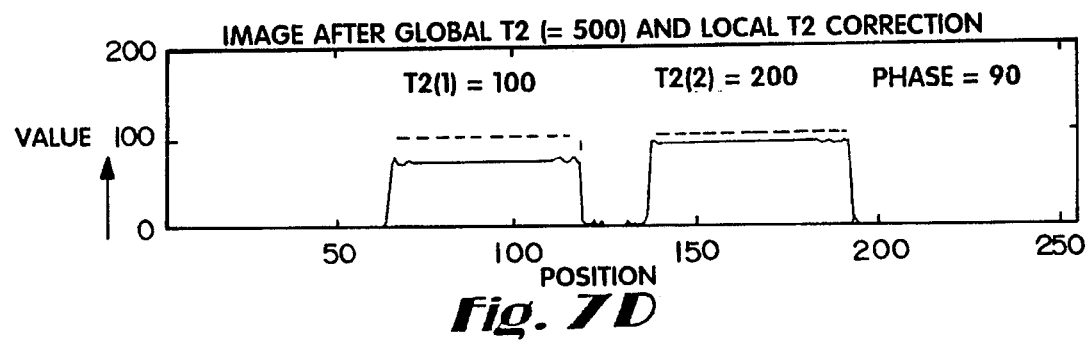

Finally, the local amplitude and phase correction technique is employed on data processed by the global T2 amplitude correction. The resulting corrected HI image by this two-stage procedure is given in FIG. 7D. It is clear from these figures that the original HI image degradation caused by amplitude attenuation, resolution loss and ringing artifacts has been effectively improved by this combined global and local data processing technique (except near the sharp edges of the objects).

The proposed method has been applied to an image of a phantom acquired in a low-field-strength (0.064 T) permanent magnet imager (ACCESS™ Toshiba-America MRI Inc.). The phantom object is a rectangular container full of mineral oil with a T2 value of about 100 ms.

Figure 8A:
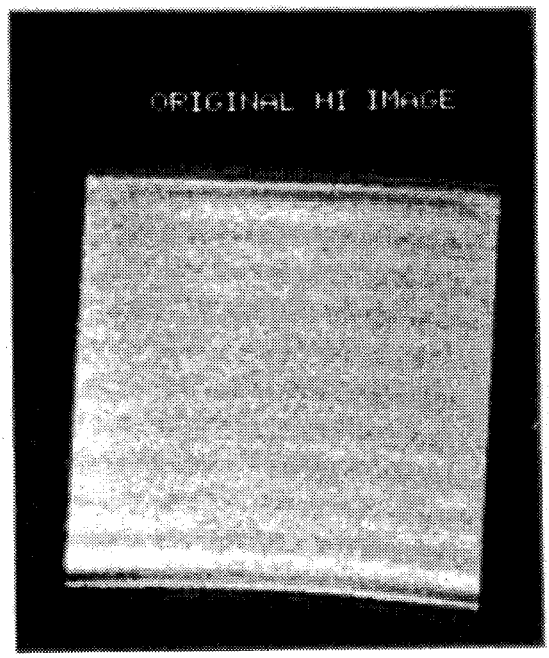
FIGS. 8A and 8B show two-dimensional phantom images before and after T2 corrections.

The asymmetric Fourier imaging (AFI) approach has been employed to further reduce the imaging time. A total of 144 phase encode projections has been acquired by 36 data acquisition shots using a four-echo band-pass sequence with echo times TE(i)=10.i ms for i=1,2,3,4. The data is then conjugated to a full image size of 256×256 pixels. The resulting T2 filter has a frequency response similar to that shown in FIG. 4 and phase encode is in the vertical direction. Because of amplitude and phase distortions introduced by the T2 distortion filter, the reconstructed image has serious ringing artifacts along the phase encoding direction as evidenced in FIG. 8A. For demonstration purposes, one of the worst cases of ringing artifacts is illustrated.

Figure 8B:
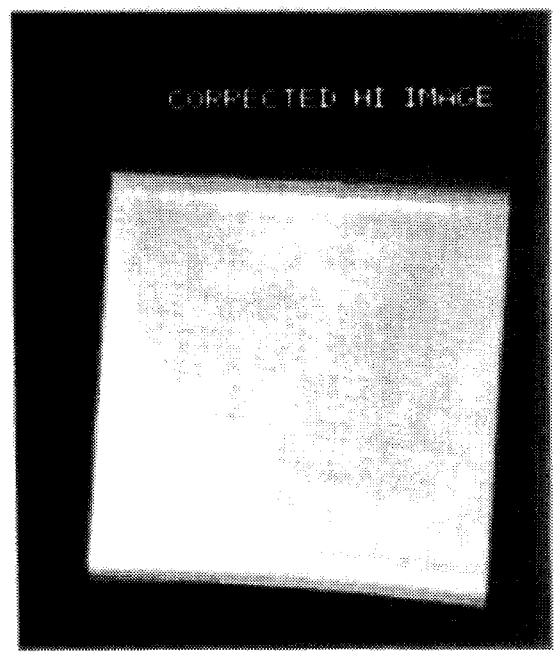

With a global T2 estimate window of $N_{T2,x}=64, N_{T2,y}=2$ and the root factor $\alpha=0.5$, the global T2 value estimated using equations (27) and (28) is 127 ms. This estimated T2 value is used in a Wiener filter for global amplitude correction on the originally acquired 144 projections. Now, 21 data samples are used for the ACF estimate and the predictor order is ten. For the AFI data case, both the global and the local corrections should be performed before conjugation and this will save computations needed for the data correction. For the given AFI data of 144 phase projections, the saving in the global T2 amplitude correction is about 44% compared with the full size data of 256 phase projections. For local corrections, the saving is 50% since only three instead of six discontinuities need to be processed. T2 corrected data are conjugated to the full image size and the improved image as shown in FIG. 8B is obtained which has much less ringing artifact. The standard deviation of the noise has been reduced form 144 to 55 by the Wiener filtering.

Figure 9A:
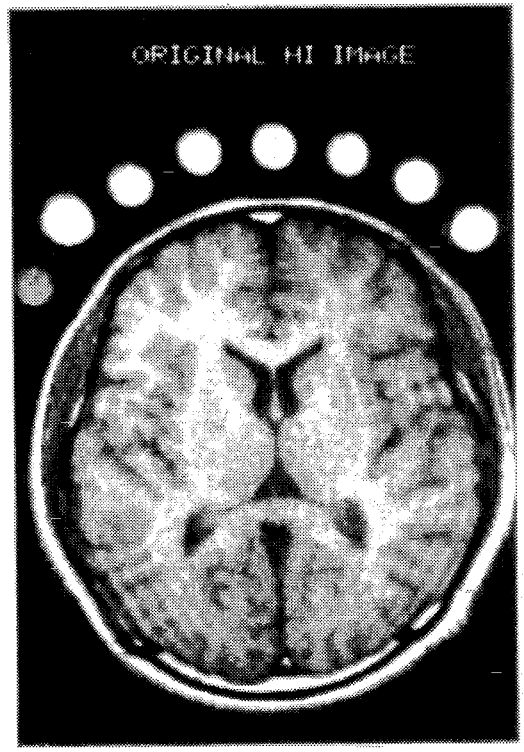
FIGS. 9A and 9B show two-dimensional human head images before and after T2 corrections.

As a further example, one image from a sequence with both sin echo and gradient echo has been tested. The sequence consists of three echoes in the echo train, one spin echo and two gradient echoes. The spin echo has an echo time 25 ms and generates the signal components $\overline{S}(k_x,k_y)$ for $86<k_y<170$. The first gradient echo has an echo time 19 ms and generates signal components $\overline{S}(k_x,k_y)$ for $1<k_y<85$. the second gradient echo has an echo time 32 ms, generating the remaining signal components. The image was acquired in a high-field-strength (1.5 T) MR image (Toshiba MRT200/FXIII). Similar to the fast spin echo case, because of T2 and T2* effects, the ringing artifacts in the reconstructed image are obvious as shown in FIG. 9A, which seriously degrade the image quality. In this image, phase encoding is in the horizontal direction.

Figure 9B:
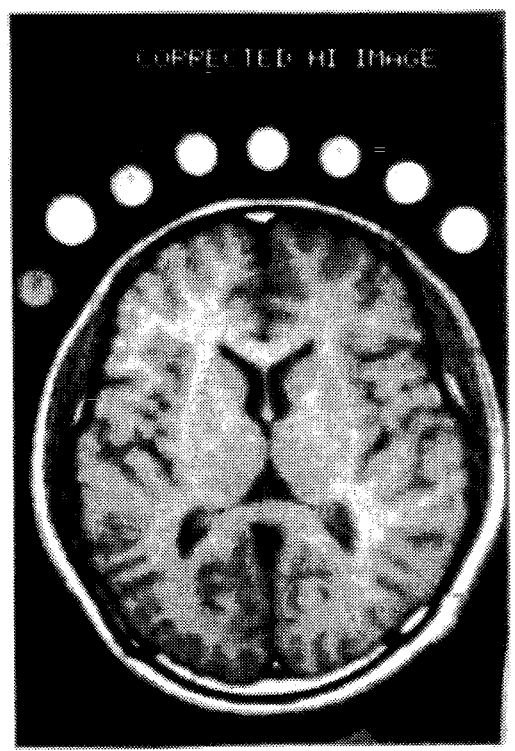

Although the echo times given above seem to define a ramp T2 filter, the actual T2filter has a low-pass shape since the dephasing effects T2*effects) caused by field inhomogeneity results in faster decay for the gradient echo signal components than from the T2 effect. In this case, the T2 amplitude attenuation factors $A_{g^1}$ for the first gradient echo and $A_{g^2}$ for the second gradient echo are estimated using signals from three extra zero phase encoding projections in the end of the sequence. The are determined by $$A_{g1} = \frac{\sum_{k_x=1}^{256} |\bar{S}_{g1}(k_x, 129)|}{\sum_{k_x=1}^{256} |\bar{S}_s(k_x, 129)|} ;$$ (37)

$$A_{g2} = \frac{\sum_{k_x=1}^{256} |\bar{S}_{g2}(k_x, 129)|}{\sum_{k_x=1}^{256} |\bar{S}_s(k_x, 129)|}$$

where $\bar{S}_s(k_x,129)$ is the zero-phase encoding signal from the standard spin echo, $\bar{S}_{g1}(k_x,129)$ and $\bar{S}_{g2}(k_x,129)$ are the zero-phase encoding signals from the fist and the second gradient echoes, respectively. For the given image, estimated attenuation factors are $A_{g1}=0.84$ and $A_{g2}=0.72$ with respect to the spin echo signal. These attenuation factors were used in the Wiener filter to make a global amplitude correction. This estimation method for global T2 amplitude attenuation factors can also be used for the FSE case. Then, the Wiener filter and the linear prediction are applied to this image and the resulting image after the two-stage processing is shown in FIG. 9B (which has improved resolution and fewer ringing artifacts). The standard deviation of noise in the host homogeneous tissue region has also been reduced from 149 to 118.

In the above experiments, the Wiener filter and the linear prediction technique have been used together to effectively improve HI image quality. For some applications, the Wiener filter can be used only to perform partial global T2 amplitude correction. For example, the sequence with a band-pass frequency response as shown in FIG. 4 is often used to emphasize signal components with middle range frequencies and obtain an edge enhanced image. In this case, for preserving the desired objective, a global Wiener T2 amplitude correction can be employed only for signal components from the third and fourth echoes to further increase high frequency components (leaving the low frequency components from the second echo untouched). Then the linear prediction technique is used to reduce ringing artifacts.

The combined use of a Wiener filter and a linear prediction technique for T2 restoration and noise suppression has been presented. The effectiveness of this method in improving HI image quality has been illustrated using some experimental results in which only estimated global T2 value (and therefore a simple frequency response function $H(k_x,k_y)$ of T2 filter) is available for the T2 amplitude restoration. This simplified model may result in under and/or over compensations for certain objects in a given image. Methods for more accurate estimate of T2 values and distributions are required to obtain better T2 correction. For local amplitude and phase correction, the simple linear prediction has been used for computation simplification. Other modeling techniques such as autoregressive moving average (ARMA) [M. R. Smith, S. T. Nichols, R. M. Henkelman and M. L. Wood, "Application of Autoregressive Moving Average Parametric Modeling in Magentic Resonance Image Reconstruction," IEEE *Trans. Med. Imag.*, Vol. 5, pp. 132–39, 1986; S. M. Kay, *Modern Spectral Estimation: Theory & Application*, Prentice Hall, Englewood Cliffs, N.J. 07632, 1988; L. B. Jackson, *Digital Filters and Signal Processing*, Second Edition, Kluwer Academic Publishers, 1989] and nonlinear prediction with neural network [H. Yan and J. Mao, "Data Truncation Artifact Reduction in MR Imaging Using a Multilayer Neural Network," IEEE *Trans. Med. Imag.*, Vol. 12, pp. 73–77, 1993] can be employed to improve the results.

As indicated above, this invention may be implemented by suitably programming the image data processor of a conventional MRI system so as to implement the above-described two-stage T2 correction (global, then local) process. The program may be provided as optional additional subroutines if desired or incorporated as permanently used non-optional added data processing routines. In any such case, the programs may be conventionally written by those skilled in the art to strightforwardly implement the above-described processes. Accordingly, no further detailed description of such computer programs is believed to be necessary.

While only a few exemplary embodiments of this invention have been described in detail, those skilled in the art will appreciate that variations and modifications in these examples may be made while yet retaining some of the novel features and advantages of the invention. All such variations and modifications are intended to be included within the scope of the appended claims.

What is claimed is:

1. A method for enhancing MRI data acquired at different NMR echo times to compensate for T2 and noise distortions, said method comprising the steps of:

deriving linear predictions of estimated local amplitude and phase for one-dimensional Fourier-transformations of MRI data in the spatial frequency domain, and utilizing said linear predictions to make local amplitude and phase corrections to such data during MR image reconstruction processing.

2. Apparatus for enhancing MRI data acquired at different NMR echo times to compensate for T2 and noise distortions, said apparatus comprising:

means for deriving linear predictions of estimated local amplitude and phase for one-dimensional Fourier-transformations of MRI data in the spatial frequency domain, and means for utilizing said linear predictions to make local amplitude and phase corrections to such data during MR image reconstruction processing.

* * * * *